United States Patent
Iskanius et al.

(12)

(10) Patent No.: US 6,867,600 B1
(45) Date of Patent: Mar. 15, 2005

(54) ELECTRONIC CIRCUIT AND METHOD FOR TESTING A LINE

(75) Inventors: Matti Iskanius, Oulu (FI); Ari-Petteri Pisila, Oulu (FI)

(73) Assignee: Nokia Corporation, Espoo (FI)

( * ) Notice: Subject to any disclaimer, the term of this patent is extended or adjusted under 35 U.S.C. 154(b) by 4 days.

(21) Appl. No.: 10/363,522

(22) PCT Filed: Sep. 23, 2000

(86) PCT No.: PCT/EP00/09309

§ 371 (c)(1),
(2), (4) Date: Apr. 25, 2003

(87) PCT Pub. No.: WO02/25299

PCT Pub. Date: Mar. 28, 2002

(51) Int. Cl.[7] .......................... G01R 27/04; G01R 31/11
(52) U.S. Cl. .................. 324/646; 324/534; 324/642
(58) Field of Search .................... 324/637, 638, 324/642, 646, 543, 527, 533, 534, 613, 76.11, 76.19; 714/724

(56) References Cited

U.S. PATENT DOCUMENTS

| | | | | |
|---|---|---|---|---|
| 3,906,411 A | * | 9/1975 | Lind et al. | ..................... 333/32 |
| 4,041,381 A | | 8/1977 | Hwa | .......................... 324/533 |
| 4,649,335 A | | 3/1987 | Lassaux et al. | ............. 324/512 |

FOREIGN PATENT DOCUMENTS

| | | | | |
|---|---|---|---|---|
| JP | 06291700 | 10/1994 | ............ | H04B/3/46 |
| WO | WO 92/11710 | 7/1992 | ............ | H04B/10/08 |
| WO | WO 99/38023 | 7/1999 | ............ | G01R/31/11 |
| WO | WO 00/16111 | 3/2000 | ............ | G01R/31/02 |

* cited by examiner

*Primary Examiner*—Vincent Q. Nguyen
(74) *Attorney, Agent, or Firm*—Cohen, Pontani, Lieberman & Pavane

(57) ABSTRACT

The invention relates to an electronic circuit and method for testing a line (10). According to the invention the signal generator (20, 30) comprises a random bit series generating means for generating a spread spectrum test signal and the evaluating unit comprises means (60–90, 200–230) for calculating and evaluating the correlation function of the test signal and the reflected signal.

42 Claims, 4 Drawing Sheets

ELECTRONIC CIRCUIT AND METHOD FOR TESTING A LINE

CROSS-REFERENCE TO RELATED APPLICATIONS

This is the U.S. national stage under 35 U.S.C. §371 of international stage application No. PCT/EP00/09309, filed Sep. 23, 2000, which date is hereby the filing date of this application under 35 U.S.C. §363.

FIELD OF THE INVENTION

The invention relates to an electronic circuit for testing a line, in particular a subscriber line for broadband data transmission.

TECHNICAL BACKGROUND OF THE INVENTION

Such a circuit is known in the art and typically comprises a signal generator for generating a test signal, a coupler for coupling the signal generator to the line and for enabling a sending of said test signal to said line. The circuit further comprises an evaluating unit for receiving from said coupler a reflected signal being generated when said test signal is sent via said line.

The invention further relates to a corresponding method for testing lines.

In prior art in particular time domain reflectrometry was used for testing lines. According to that method a short pulse was sent to the line and a reflected signal of said short pulse was measured. Said reflected signal might be caused from any impedance discontinuities on the line. When evaluating said reflected signal, faults on the line can be located or the suitability of the line for a particular purpose can be predicted.

However, implementation of such traditional electronic circuits and methods is complicated and quite expensive. Moreover, the traditional systems are very sensitive to disturbances and noise on the line with the result that they operate less accurately.

OBJECT OF THE INVENTION

Starting from that prior art it is the object of the invention to improve an electronic circuit and method for testing a line, in particular a subscriber line in that the system and method operates more accurate and implementation thereof is facilitated and made less expensive.

SUMMARY OF THE INVENTION

For the above defined system this object is solved in the way that the signal generator comprises a random bit series generating means for generating a spread spectrum test signal and that said evaluating unit comprises means for calculating and evaluating the correlation function of said test signal and said reflected signal.

The usage of such a test signal and such means allows the usage of low measurement frequencies with the result that the performance, the accuracy and the measurement range is improved, because the attenuation of the line is strongly frequency dependent.

Moreover, accuracy is increased because the system according to the invention is less sensitive to noise and other disturbances present on the line. Further, implementation of the system is reasonably simple and cheap.

According to a first embodiment the random bit generating means is a pseudo random bit series PRBS generator implementation of which is quite simple.

It is advantageous that said means of the evaluating unit comprise an adjustable delay unit for adjustably delaying the spread spectrum test signal as generated by said PRBS generator, a second D/A converter for converting the delayed test signal into an analog delayed test signal, a mixer for multiplying the analog delayed spread spectrum test signal with the analog received reflected signal and an integrator for integrating the output signal of said mixer for variable delays of said spread spectrum test signal. Said components of said means advantageously enable an analog calculation of the correlation function of the reflected signal and the delayed test signal wherein the correlation function enables assessment of the similarity of the reflected signal and the delayed test signal. The similarity of these signals allows the location of faults on the tested line or the prediction of as to whether the line is suitable for a particular application, e.g. for broadband data transmission.

Alternatively to the embodiment of the evaluating unit described above the evaluating unit may comprise a second A/D converter for converting the analog reflected signal received from said coupler into a digital signal and a second processor for calculating the correlation function from said digitized reflected signal and the digital random bit series as generated by said signal generator. Advantageously said alternative embodiment of the evaluating unit enables a digital calculation of the correlation function.

Preferably, the coupler is embodied as line-hybrid coupler comprising two parallel branches, each comprising a series connection of impedances wherein the spread spectrum test signal is input to said coupler in parallel to said branches and wherein the reflected signal is received between two connecting points defining the connection between two impedances of a series connection, respectively. The line is connected to the coupler via a transformer such that the input impedance of said transformer being loaded with the impedance of said line represents one of said coupler impedances.

Advantageously said coupler and in particular said line-hybrid coupler, enables a directional coupling of the electronic circuit to the line.

LISTING OF THE FIGURES

In the following several embodiments of the invention are described in more detail by referring to the accompanying figures, wherein.

DETAILED DESCRIPTION OF THE EMBODIMENTS OF THE INVENTION

Figure 1:
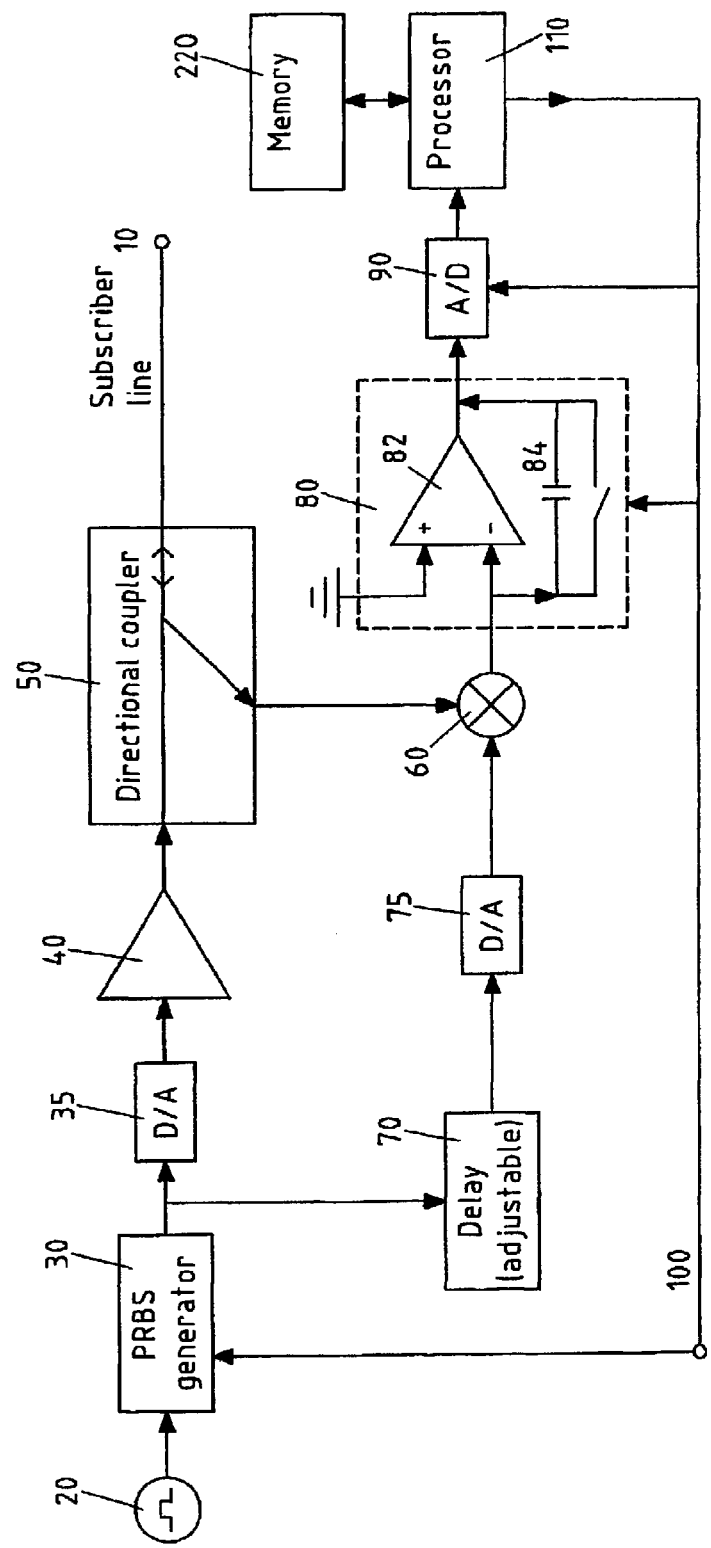
FIG. 1 shows a first embodiment of the electronic circuit according to the invention.

FIG. 1 shows a first embodiment of the electronic circuit according to the invention for testing a subscriber line 10. The electronic circuit comprises an adjustable clock generator 20 being coupled to a digital pseudo random bit series PRBS generator 30 for generating a PRBS-signal. The operation clock rate of the electronic circuit can be changed by changing the frequency of the clock generated by said adjustable clock generator 20.

The PRBS-signal represents a spread spectrum test signal. Said test signal is converted into an analog signal by a first digital to analog D/A converter 35 and amplified by an amplifier 40 before being output to a directional coupler 50.

The directional coupler 50 enables the transmission of said analog amplified spread spectrum test signal to said subscriber line 10 and further enables the reception of the reflected signal from said spread spectrum test signal caused by impedance discontinuities on the subscriber line 10.

Said received reflected signal is mixed in a mixer 60 with said spread spectrum test signal, which has been adjustably delayed by an adjustable delay unit 70 and converted into an analog signal by a second D/A-converter 75.

The signal output by said mixer 60 is input to an integrator 80 for being integrated. The integrator 80 is preferably, but not necessarily realised by an operational amplifier 82 which is connected accordingly. According to FIG. 1 the output signal of the mixer 60 is input to the inverting input of said operational amplifier 82 whereas its non-inverting input is connected to ground. A capacitor 84 is connected between the inverting input of the operational amplifier 82 and its output in order to enable an operation of said operational amplifier as integrator.

With the help of the adjustable delay unit 70, the mixer 60 and the analog integrator 80 the correlation function between the delayed spread spectrum test signal and the reflected signal is calculated in an analog manner. The values of said correlation function are output by said integrator 80. An evaluation of said calculated correlation values provide information about the similarity of the received reflected signal and the delayed test signal and thus, about the location of faults on the subscriber line or the suitability of the subscriber line 10 for a particular desired application, e.g. for broadband data transmission (xDSL wherein DSL means Digital Subscriber Line).

According to FIG. 1 the analog correlation values output by the integrator 80 are digitised by a first analog/digital A/D converter 90 before being provided to a first processor 110 which serves for storing and reading out said correlation values in/from a memory 220.

The PRBS-generator 30, the integrator 80 as well as said first A/D converter 90 are connected to a reset line 100 for being reset by a reset signal being generated by said processor 110; in that way the processor 110 serves for controlling the generation of the correlation values which represent a measurement sequence. The integrator 80 is reset by shunting said capacitor 84.

Figure 2:
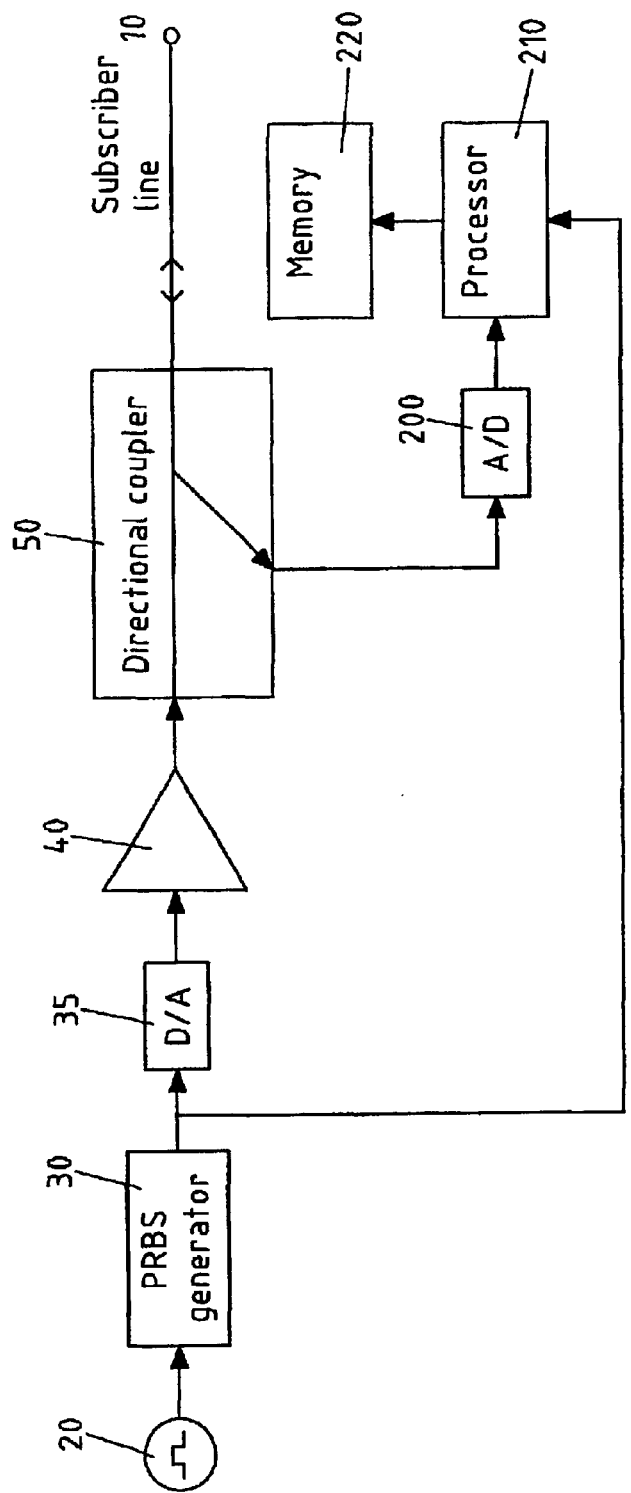
FIG. 2 shows a second embodiment of the electronic circuit according to the invention.

FIG. 2 shows a second embodiment of the electronic circuit according to the invention. The subscriber line 10, the adjustable clock generator 20, the PRBS generator 30, the first D/A-converter 35, the amplifier 40, the directional coupler 50 and the memory 220 as well as the operations thereof correspond to the identical components and operations thereof as described for the first embodiment by referring to FIG. 1.

However, the second embodiment differs from the first embodiment in that the correlation function is calculated digitally. For achieving that purpose the reflected analog test signal received from the directional coupler 50 is digitised by a second analog to digital converter 200 before being communicated to a second processor 210. The second processor is further connected to the output of said PRBS generator 30 for receiving the spread spectrum test signal which is a pseudo random bit series. The processor 210 calculates the correlation function form the digitised reflected signal and the test signal and outputs the calculated correlation values to the memory 220.

Figure 3:
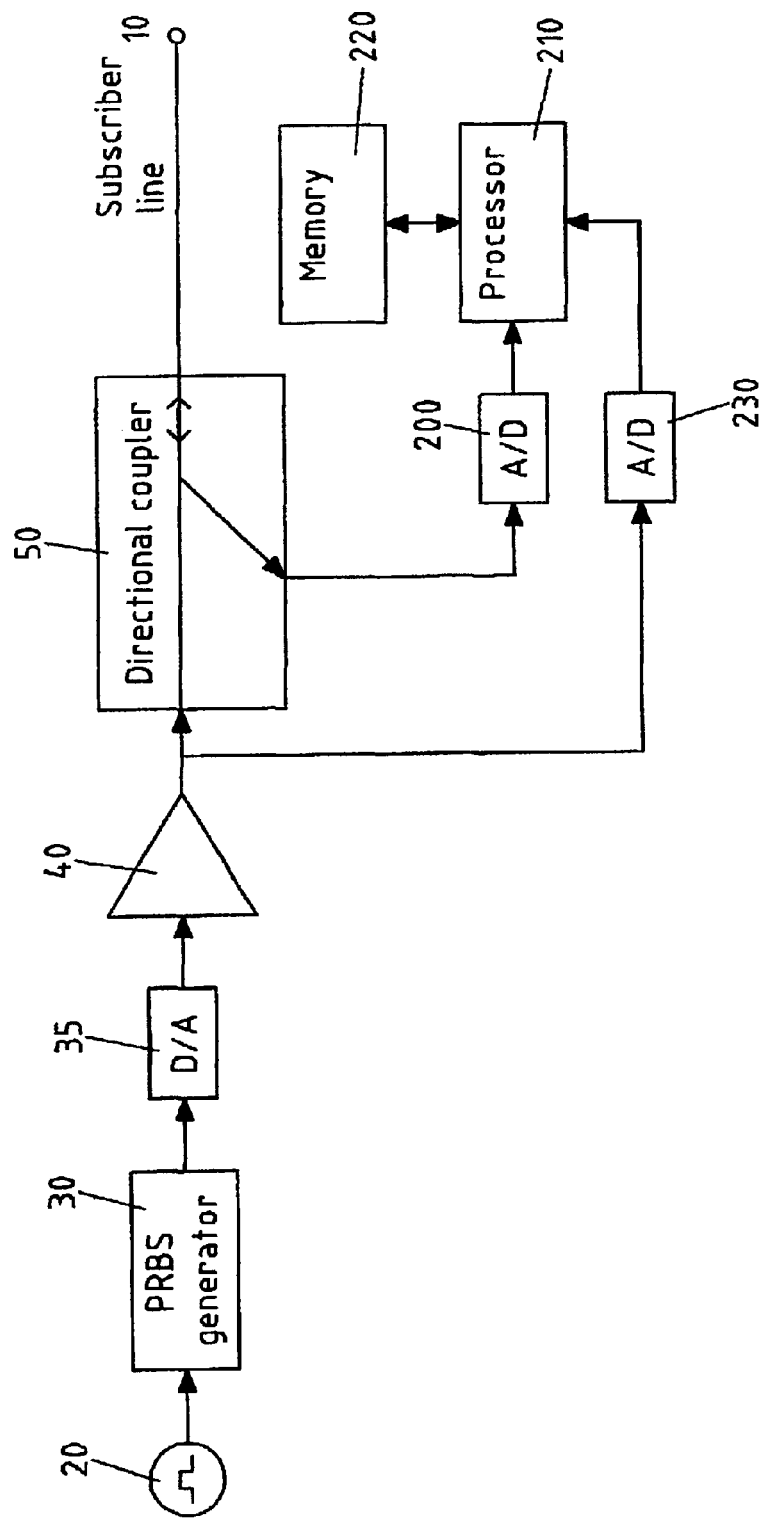
FIG. 3 shows a third embodiment of the electronic circuit according to the invention.

FIG. 3 shows a third embodiment of the electronic circuit according to the invention. It only differs from the second embodiment as described by referring to FIG. 2 in that the second processor 210 is not connected to the output of said PRBS generator 30 but to the output of the amplifier 40. The amplifier 40 outputs the spread spectrum test signal in an analog form and thus a third A/D converter 230 is required for digitising the test signal before being input to said processor 210.

Figure 4:
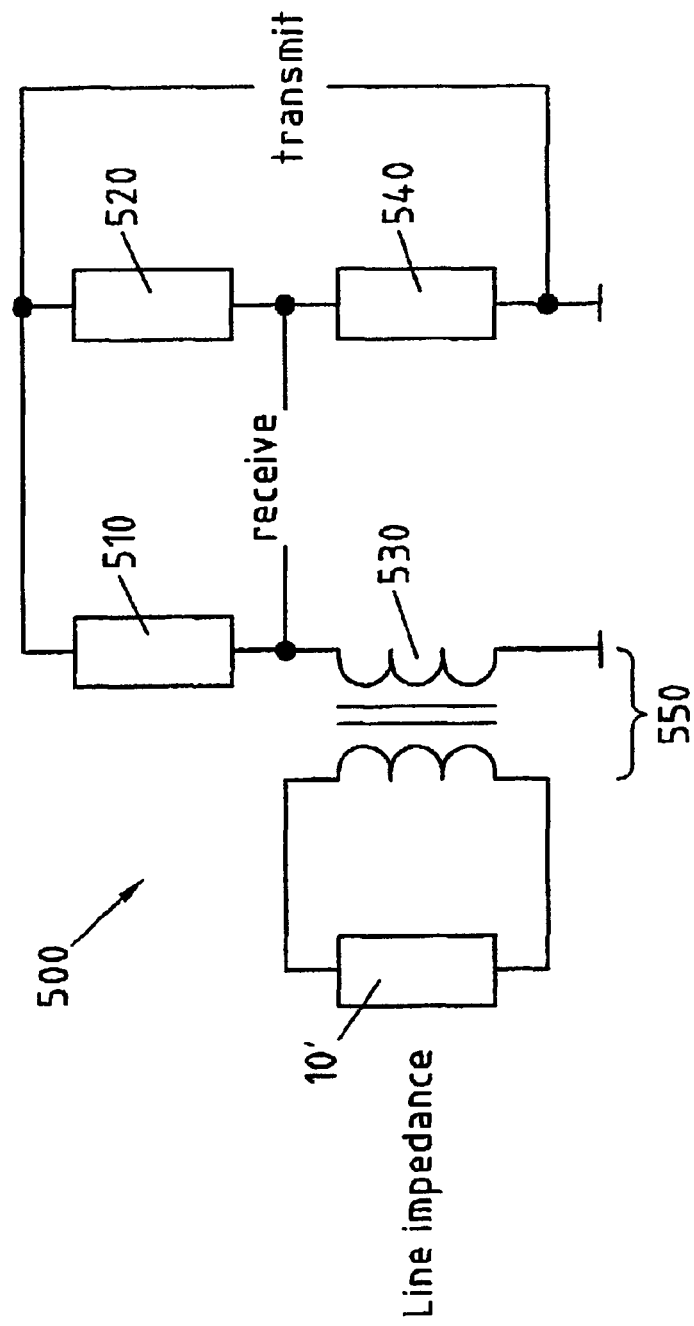
FIG. 4 shows a block diagram of a line hybrid coupler as used in any of the embodiments of the electronic circuit.

FIG. 4 shows a specific embodiment of the directional coupler as used in any of the embodiments of the electronic circuit according to the present invention. In said embodiment the directional coupler is embodied as a line hybrid coupler 500. The coupler 500 comprises two parallel branches each comprising a series connection of impedances 510, 520, 530 and 540. The impedance 530 is the input impedance of a transformer 550 being connected to the subscriber line 10. In FIG. 3 said subscriber line is represented by its line impedance 10'.

The spread spectrum test signal is input to said coupler 500 in parallel to said branches and the reflected signal is received between two connection points defined by the connections between the two impedances in said series connections, respectively.

What is claimed is:

1. An electronic circuit for testing a subscriber line comprising:

a signal generator comprising a pseudo-random bit series (PRBS) generator for generating a spread spectrum test signal;

a coupler for coupling the signal generator to the line, for transmitting test signal on said line, and for receiving a reflected signal generated on said line when said test signal is transmitted; and an evaluating unit connected to said coupler for receiving from said coupler the reflected signal, said evaluating unit comprising:

an adjustable delay unit for adjustably delaying said test signal;

a digital to analog (D/A) converter for converting said delay test signal into an analog delayed test signal;

a mixer for multiplying the delayed analog test signal with the reflected signal;

an integrator for integrating the output signal of said mixer in order to generate a correlation function of said test signal and said reflected signal; and a processor for receiving and evaluating the generated correlation function.

2. The electronic circuit according to claim 1, wherein the coupler is a directional coupler.

3. The electronic circuit according to claim 1, further comprising:

a reset line connected to at least one of the PRBS generator, the integrator, and/or a analog to digital (A/D) converter which converts the output of the PRBS generator to an analog signal before it is input to the coupler; thereby controlling the generation of correlation values which comprise a measurement sequence.

4. The electronic circuit according to claim 1, wherein the coupler is a line hybrid coupler.

5. The electronic circuit according to claim 1, further comprising:

a digital to analog (D/A) converter for converting the spread spectrum text signal into an analog signal before it is input to the coupler.

6. The electronic circuit according to claim 1, further comprising:

an analog to digital (A/D) converter for converting the output of the integrator into a digital signal before it is input to the processor.

7. The electronic circuit according to claim 1, wherein the subscriber line comprises a Digital Subscriber Line (DSL).

8. An electronic circuit for testing a subscriber line comprising:
   a signal generator comprising a random bit series generating means for generating a digital spread spectrum test signal;
   a coupler for coupling the signal generator to the line, for transmitting said test signal on said line, and for receiving a reflected signal generated on the line when the test signal is transmitted; and
   an evaluating unit connected to said coupler for receiving from said coupler the reflected signal, and for calculating and evaluating the correlation function of said test signal and said reflected signal, said evaluating unit comprising:
      an analog to digital (A/D) converter for converting the reflected analog signal received from said coupler into a digital signal; and
      a processor for calculating the correlation function of the digital spread spectrum test signal as output by said signal generator and said digitized reflected signal.

9. The electronic circuit according to claim 8, wherein the random bit generating means is a pseudo random bit series (PRBS) generator.

10. The electronic circuit according to claim 8, wherein the coupler is a directional coupler.

11. The electronic circuit according to claim 8, wherein the coupler is a line hybrid coupler.

12. The electronic circuit according to claim 8, wherein the subscriber line comprises a Digital Subscriber Line (DSL).

13. The electric circuit according to claim 8, further comprising:
   a digital to analog (D/A) converter for converting the spread spectrum text signal into an analog signal before it in input to the coupler.

14. The electronic circuit according to claim 13, further comprising:
   an analog to digital (A/D) converter for converting the analog spread spectrum text signal output the D/A converter into a digital signal before it is input to the processor.

15. The electronic circuit according to claim 8, wherein the coupler comprises:
   two parallel branches, each comprising a series connection of impedances, wherein the test signal is input to said coupler in parallel to said branches, and wherein the reflected signal is received between two connecting points, one of said two connecting points being located on a connection between two of the impedances connected in series in one parallel branch, and the other connecting point being located on a connection between two of the impedances connected in series in the other parallel branch; and
   a transformer connecting the line to the coupler wherein the input impedance of said transformer comprises the load of said line and the output impedance comprises one of said impedances in one of said two parallel branches.

16. An electronic circuit for testing a subscriber line comprising:
   a signal generator comprising a random bit series generating means for generating a digital spread spectrum test signal;
   a coupler for coupling the signal generator to the line, for transmitting said test signal on said line, and or receiving a reflected signal generated on the line when the test signal is transmitted, the coupler comprising:
      two parallel branches, each comprises a series connection of impedances, wherein the test signal is input to said coupler in parallel to said branches, and wherein the reflected signal is received between two connecting points one of said two connecting points being located on a connection between two of the impedances connected in series in one parallel branch, and the other connecting point being located on a connection between two of the impedances connected in series in the other parallel branch; and
      a transformer connecting the line to the coupler wherein the input impedance of said transformer comprises the load of said line and the output impedance comprises one of said impedances in one of said two parallel branches; and
   an evaluating unit connected to said coupler for receiving from said coupler the reflected signal, and for calculating and evaluating the correlation function of said test signal and said reflected signal.

17. The electronic circuit according to claim 16, wherein the random bit generating means is a pseudo random bit series (PRBS) generator.

18. The electronic circuit according to claim 17, wherein said evaluating means further comprises:
   an adjustable delay unit for adjustably delaying the spread spectrum test signal as generated by said PRBS generator;
   a digital to analog (D/A) converter for converting said delayed test signal into an analog signal;
   a mixer for multiplying the delayed analog test signal with the reflected signal; and
   an integrator for integrating the output signal of said mixer in order to generate a correlation function of said test signal and said reflected signal.

19. The electronic circuit according to claim 18, further comprising:
   a processor for receiving and evaluating the generated correlation function.

20. The electronic circuit according to claim 16, wherein the subscriber line comprises a Digital Subscriber Line (DSL).

21. The electronic circuit according to claim 16, further comprising:
   a digital to analog (D/A) converter for converting the spread spectrum text signal into an analog signal before it is input to the coupler.

22. A method for testing a subscriber line, comprising the steps of:
   generating a spread spectrum test signal with a random bit series generating means;
   transmitting, via a coupler, said test signal on said line;
   receiving by said coupler, a reflected signal generated on said line when the test signal is transmitted;
   selectively delaying the test signal directly output from the generating means;
   converting the delayed test signal into an analog signal;
   mixing the delayed analog test signal with the reflected signal;

integrating the output of the mixing step in order to generate a correlation function of said test signal and said reflected signal; and evaluating the correlation function of said test signal and said reflected signal.

23. The method according to claim 22, wherein the coupler is a directional coupler.

24. The method according to claim 22, wherein the coupler is a line hybrid coupler.

25. The method according to claim 22, further comprising the step of:

resetting at least one of the PRBS generator, the integrator, and/or a analog to digital (A/D) converter which converts the output of the PRBS generator to an analog signal before it is input to the coupler, thereby controlling the generation of correlation values which comprise a measurement sequence.

26. The method according to claim 22, further comprising the step of:

converting the spread spectrum text signal into an analog signal before it is input to the coupler.

27. The method according to claim 22, further comprising the step of:

converting the output of the integrating step into a digital signal before the evaluating step.

28. The method according to claim 22, wherein the subscriber line comprises a Digital Subscriber Line (DSL).

29. A method for testing a subscriber line comprising the steps of:

generating a spread spectrum test signal with a random bit series generating means;

transmitting, via a coupler, said test signal on said line;

receiving, by said coupler, a reflected signal generated on said line when the test signal is transmitted;

converting the reflected signal from the coupler into a digital signal;

receiving, by a processor, the digitized signal and the test signal;

calculating, by a processor, the correlation function of the digitized reflected signal and said test signal; and evaluating, by the processor, the calculated correlation function.

30. The method according to clam 29, wherein the random bit generating means is a pseudo random bit series (PRBS) generator.

31. The method according to claim 29, wherein the coupler is a directional coupler.

32. The method according to claim 29, wherein the coupler is a line hybrid coupler.

33. The method according to claim 29, wherein the subscriber line comprises a Digital Subscriber Line (DSL).

34. The method according to claim 29, further comprising:

converting the spread spectrum text signal into an analog signal before it is input to the coupler.

35. The method acceding to claim 34, further comprising the steps of:

converting the analog spread spectrum text signal into a digital signal before it is input to the processor.

36. The method according to claim 29, wherein the step of transmitting, by the coupler, the test signal comprises the step of:

receiving, by the coupler, the test signal in parallel to two parallel branches, each branch comprising a series connection of impedances; and wherein the step of receiving, by the coupler, the reflected signal comprises the step of:

receiving, by the coupler, the reflected signal between two connecting points, one of said two connecting points being located on a connection between two of the impedances connected in series in one parallel branch, and the other connecting point being located on a connection between two of the impedances connected in series in the other parallel branch.

37. The method according to claim 36, wherein a transformer connects the line to the coupler wherein the input impedance of said transformer comprises the load of said line and the output impedance comprises one of said impedances in one of said two parallel branches.

38. A method for testing a subscriber line comprising the steps of:

generating a spread spectrum test signal with a random bit series generating means;

receiving, by a coupler, the test signal in parallel to two parallel branches, each branch comprising a series connection of impedances, and transmitting said test signal on said line;

receiving, by said coupler, a reflected signal generated on said line when the test signal is transmitted, wherein the reflected signal is received between two connecting points, one of said two connecting points being located on a connection between two of the, impedances connect in series in one parallel branch, and the other connecting point being located on a connection between two of the impedances connected in series in the other parallel branch;

receiving, by an evaluation unit, the reflected signal from the coupler;

receiving, by the evaluating unit, the test signal from the random bit series generating means;

calculating, by the evaluating unit, the correlation function of the reflected signal and said test signal; and evaluating, by the evaluating unit, the calculated correlation function.

39. The method according to claim 38, wherein the random bit generating means is a pseudo random bit series (PRBS) generator.

40. The method according to claim 38, wherein the step of calculating by the evaluating unit, the correlation function of the reflected signal and said test signal comprises the steps of:

selectively delaying the received test signal;

converting the delayed test signal into an analog signal;

mixing the delayed analog test signal with the received reflected signal; and integrating the output of the mixing step in order to generate a correlation function of said test signal and said reflected signal.

41. The method according to claim 38, wherein the subscriber line comprises a Digital Subscriber Line (DSL).

42. The method according to claim 38, further comprising:

converting the spread spectrum text signal into an analog signal before it is input to the coupler.

* * * * *